US009393543B2

(12) United States Patent
Novoselov

(10) Patent No.: US 9,393,543 B2
(45) Date of Patent: Jul. 19, 2016

(54) PLASMA CHEMICAL DEVICE FOR CONVERSION OF HYDROCARBON GASES TO LIQUID FUEL

(71) Applicant: EVOEnergy, LLC, Seattle, WA (US)

(72) Inventor: Yury Novoselov, Seattle, WA (US)

(73) Assignee: EVOENERGY, LLC, Seattle, WA (US)

( * ) Notice: Subject to any disclaimer, the term of this patent is extended or adjusted under 35 U.S.C. 154(b) by 0 days.

(21) Appl. No.: 14/383,872

(22) PCT Filed: Mar. 4, 2013

(86) PCT No.: PCT/US2013/028811
§ 371 (c)(1),
(2) Date: Sep. 8, 2014

(87) PCT Pub. No.: WO2013/134093
PCT Pub. Date: Sep. 12, 2013

(65) Prior Publication Data
US 2015/0044105 A1 Feb. 12, 2015

Related U.S. Application Data

(60) Provisional application No. 61/608,907, filed on Mar. 9, 2012.

(51) Int. Cl.
*B01J 19/08* (2006.01)
*H01J 37/32* (2006.01)
(Continued)

(52) U.S. Cl.
CPC ............... *B01J 19/088* (2013.01); *B01J 4/001* (2013.01); *C10G 50/00* (2013.01);
(Continued)

(58) Field of Classification Search
CPC ............ B01J 19/088; B01J 2219/0809; B01J 2219/0869; B01J 2219/0875; B01J 2219/0896; B01J 2219/0871; B01J 37/3216; B01J 4/001; B01J 2219/0813; B01J 2219/0828; B01J 2219/083; B01J 2219/0839; B01J 2219/0841; H01J 37/3216; H01J 37/32146; C01G 50/00; C01G 2/00
See application file for complete search history.

(56) References Cited

U.S. PATENT DOCUMENTS 4,553,983 A * 11/1985 Baker ............................ 95/50
5,617,741 A 4/1997 McNeil et al.
(Continued)

FOREIGN PATENT DOCUMENTS

CA 2621749 8/2009
EP 0 398 849 11/1990
(Continued)

OTHER PUBLICATIONS

International Search Report and Written Opinion received in International Application No. PCT/US13/28811 issued May 6, 2013, 8 pages.
(Continued)

*Primary Examiner* — Xiuyu Tai
(74) *Attorney, Agent, or Firm* — Foley & Lardner LLP

(57) ABSTRACT

A system with a non-thermal, repetitively-pulsed gliding discharge reactor for converting gaseous hydrocarbons into liquid fuels efficiently. The system optionally contains a gas separator for removing non-hydrocarbon components from the gaseous hydrocarbon feed to improve efficiency of the system. The system may optionally reclaim hydrogen gas from the product gas for storage, transportation or power generation.

21 Claims, 5 Drawing Sheets

(51) Int. Cl.
*C10G 50/00* (2006.01)
*B01J 4/00* (2006.01)

(52) U.S. Cl.
CPC ... *H01J 37/32146* (2013.01); *B01J 2219/0809* (2013.01); *B01J 2219/0869* (2013.01); *B01J 2219/0871* (2013.01); *B01J 2219/0875* (2013.01); *B01J 2219/0896* (2013.01)

(56) References Cited

U.S. PATENT DOCUMENTS

| | | | |
|---|---|---|---|
| 6,205,813 | B1 | 3/2001 | Shah et al. |
| 6,375,832 | B1 | 4/2002 | Eliasson et al. |
| 7,033,551 | B2 | 4/2006 | Kong et al. |
| 2002/0000085 | A1* | 1/2002 | Hall et al. ............ 60/39.02 |
| 2003/0136661 | A1 | 7/2003 | Kong et al. |
| 2003/0141182 | A1 | 7/2003 | Kong et al. |
| 2006/0156620 | A1 | 7/2006 | Clayton et al. |
| 2006/0163113 | A1 | 7/2006 | Clayton et al. |
| 2008/0289494 | A1 | 11/2008 | Boutot et al. |
| 2009/0038933 | A1 | 2/2009 | Boutot et al. |
| 2009/0056222 | A1 | 3/2009 | Gutsol et al. |
| 2009/0196804 | A1 | 8/2009 | Masuda et al. |
| 2010/0041776 | A1 | 2/2010 | Czernichowski et al. |
| 2010/0272619 | A1 | 10/2010 | Frydman et al. |
| 2011/0009502 | A1 | 1/2011 | Marion et al. |
| 2011/0190565 | A1 | 8/2011 | Novoselov et al. |
| 2012/0297665 | A1* | 11/2012 | Goerz, Jr. ............ C10G 15/08 44/301 |
| 2013/0020189 | A1* | 1/2013 | Witherspoon ............ 201/29 |

FOREIGN PATENT DOCUMENTS

| | | |
|---|---|---|
| RU | 2088565 | 8/1997 |
| RU | 2249609 | 4/2005 |

OTHER PUBLICATIONS

International Search Report and Written Opinion received in International Application No. PCT/RU2010/000032 issued Nov. 2, 2010, 7 pages.
Non-Final Office Action issued in U.S. Appl. No. 13/015,321 mailed Nov. 1, 2013 (13 pages).
Written Opinion and Search Report issued in Singapore Application No. 201205475-5 issued Nov. 14, 2013 (17 pages).
First Office Action received in Russian Patent Application No. 2012131662 issued Jan. 1, 2014 (7 pages)—with English translation.
Office Action received in Japanese Patent Application No. 2012-551115 mailed Jan. 6, 2014 (5 pages)—with English translation.
First Office Action received in Chinese Application No. 201080065879.8 issued Jan. 10, 2014 (2 pages)—English Translation Only.
Notice of Allowance received in U.S. Appl. No. 13/015,321 mailed Mar. 14, 2014, 10 pages.
Patent Examination Report No. 1 received in Australian Patent Application No. 2010344282 issued Aug. 22, 2014, 2 pages.

* cited by examiner

PLASMA CHEMICAL DEVICE FOR CONVERSION OF HYDROCARBON GASES TO LIQUID FUEL

CROSS-REFERENCE TO RELATED APPLICATIONS

This application is a U.S. national phase application under 35 U.S.C. 371 of International Application No. PCT/US2013/028811, filed on Mar. 4, 2013, which claims the benefit of priority to U.S. Provisional Patent Application No. 61/608,907, filed on Mar. 9, 2012, both of which are incorporated herein by reference in their entirety for any and all purposes.

TECHNOLOGY

This technology is generally related to fuel production. More specifically, it is related to the transformation of a hydrocarbon gas to a liquid hydrocarbon.

BACKGROUND

It is currently estimated that there are between 3 and 12 billion dollars a year of natural gas was lost to flare off due to an inability to capture, refine, and/or transport it effectively. While methods are known for capture, refinement and/or transport of natural gases, they tend to be cumbersome and not readily amenable for use in remote or offshore natural gas deposit locations.

Natural gases may be converted to liquid fuels by a variety of known methods. For example, such methods include Fischer-Tropsch and Mobil Processes, as well as plasma-assisted gas-to-liquid (GTL) techniques. The Fischer-Tropsch and Mobil Processes involve multi-stage synthetic steps where a light hydrocarbon (i.e. hydrocarbon gas) is initially transformed to syngas, under high pressure and high temperatures of up to 1300 K. Syngas is a mixture of carbon monoxide (CO) and hydrogen ($H_2$). It is typically formed by oxygen-deprived combustion of the hydrocarbon gas. The following reactions are exemplary of these well-known processes:

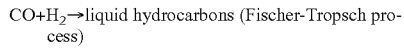
CO+$H_2$→liquid hydrocarbons (Fischer-Tropsch process)

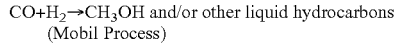
CO+$H_2$→$CH_3OH$ and/or other liquid hydrocarbons (Mobil Process)

Because of the extreme thermal operating conditions, syngas reformers are massive to build and are expensive to operate. GTL plants, in order to be commercially viable, need to be very large and complex. High operating energy consumption is required for gas compression and heating, and accounts for approximately 60-80% of all costs for fuel production by such methods. Furthermore, generally expensive reformation catalysts are used in all stages of the conventional processes, and require catalyst recovery from the systems.

Another approach to the conversion of light hydrocarbons to liquid fuels is via a non-thermal plasma-assisted method. U.S. Pat. No. 7,033,551 (the '551 patent) discloses a reactor system having an electrochemical cell and a dielectric barrier discharge, where the formation of liquid products occurs primarily through the oligomerization of gaseous hydrocarbon radicals in a non-thermal plasma of a barrier gas discharge. Non-thermal plasmas provide an initial radical concentration via dissociation of light alkane molecules by energetic electrons at low gas temperature (about 100° C. to about 600° C.) under atmospheric gas pressure. Electrochemical cells in conjunction with the barrier discharge allows for oxidation of excess hydrogen in the plasma, partial oxidation, and oxidative condensation of the primary gas. The final composition includes a mixture of liquid hydrocarbons, of which a minority are alcohols.

The method described in U.S. Pat. No. 7,033,551 is based on the implementation of dissociation processes that occur under the action of "hot" electrons on hydrocarbon molecules inside the barrier discharge reactor according to reaction (1):

$$e^- + RH \rightarrow R\cdot + H\cdot + e^- \quad (1)$$

In reaction (1), RH is a general formula for a hydrocarbon and $e^-$ is an electron. The radicals R. and H. are formed at high activation energies (>400 kJ/mol) in such processes. Similar processes with a similarly high activation energy may also be facilitated through a light-assisted process, where an ultraviolet (UV) radiation source (hv) provides the requisite energy, as described by the '551 patent:

$$h\nu + RH \rightarrow R\cdot + H\cdot \quad (2)$$

The large activation energy requirement for reactions (1) and (2) is due to the energy state of the unactivated hydrocarbon molecule lying at a level that is much lower than the energy state of its dissociated components. Each bond breaking event (i.e. dissociation) through electron impact takes place only via electronic state excitation, and in doing so consumes a significant amount of energy. Taking into account the energy released on reformation of higher hydrocarbons (reaction (3)) after the dissociation reactions above:

$$2R\cdot \rightarrow R_2 \quad (3)$$

the energy consumption for the process typically is higher than 100 kW*h per 1 kg of the end product.

U.S. Pat. No. 6,375,832 (the '832 patent) discloses the synthesis of liquid products under the action of a barrier discharge, while the use of a catalyst is optional. In the synthetic process described by the '832 patent, oligomers of hydrocarbon radicals are produced as a result of dissociation of the feed gas, and reformation of hydrocarbons from free radical fragments through direct coupling and oxidative condensation:

$$CH_4 \rightarrow C_2H_6 \rightarrow C_4H_{10} \quad (4)$$

If $CO_2$ is introduced into the feeding gas mix as an oxidant, then carbon dioxide conversion also occurs and contributes to the formation of the liquid hydrocarbons. Alcohols may also be produced as a result of $CO_2$ decomposition. Such processes are summarized by reactions 5-7:

$$CO_2 + e^- \rightarrow CO + O\cdot + e^- \quad (5)$$

$$RH + O\cdot \rightarrow R\cdot + OH \quad (6)$$

$$R\cdot + OH\cdot \rightarrow ROH \quad (7)$$

Limiting factors of the above plasma-assisted methods are: the non-chain character of conversion processes in the barrier discharge reactor and the high activation energy (>400 kJ/mol) of the primary radical formation process. Consequently, the specific energy consumption for the production of liquid products commonly exceeds 100 kW*h per 1 kg of product. Another significant limitation of the barrier discharge plasma-assisted methods is the low current ($10^{-5}$-$10^{-3}$ $A/cm^2$) and power density of the barrier discharge plasma (1-10 $W/cm^3$), which reduces the capability of the reactor systems. Furthermore, the above plasma-assisted methods control only the feed gas temperature.

A plasma chemical reactor may be used for converting gaseous hydrocarbons to liquid fuels as described in co-pending application 2011/0190565. With regard to processing gaseous hydrocarbons such as natural gas, there are a large amount of non-hydrocarbon components such as nitrogen. In some cases, nitrogen may take up to 25% of total volume of the gaseous hydrocarbon, which reduces the efficiency of the plasma chemical reactor. Thus, there is a need to build a system that is more efficient for converting gaseous hydrocarbon to liquid fuel.

SUMMARY

In one aspect, a system is provided having (a) a power source that is a high-voltage pulse generator; (b) a reactor having an inlet for a gaseous hydrocarbon, an outlet for a liquid hydrocarbon composition to exit the reactor, an outlet for product gas to exit the reactor, and a plurality of first electrodes separated from a plurality of second electrodes by a discharge region; and (c) a gas separator connected to the reactor such that the gas separator comprises an inlet for the feed gas stream and an outlet for a concentrated hydrocarbon composition, and the concentrated hydrocarbon composition from the gas separator is fed into the reactor.

In some embodiments, the concentrated hydrocarbon composition exiting the gas separator has a lower concentration of a non-hydrocarbon component compared to the feed gas stream entering the gas separator. In some embodiments, the non-hydrocarbon component is nitrogen. In some embodiments, the gas separator has a membrane for separating a non-hydrocarbon component from the feed gas stream entering the gas separator. In other embodiments, the gas separator is a sorbent/solvent-based system or a cryogenic separation system. In some embodiments, the system has a receiver in communication with the gas separator wherein the receiver is configured to feed the feed gas stream into the gas separator. In some embodiments, the system includes a gas reclaimer with an inlet for a gas and an outlet for a reclaimed gas where the product gas from the reactor is fed into the gas reclaimer.

In one aspect, a system is provided containing: (a) a high-voltage pulse generator; (b) a reactor containing an inlet for a gaseous hydrocarbon, an outlet for a liquid hydrocarbon composition to exit the reactor, and an outlet for product gases to exit the reactor and a plurality of first electrodes each individually connected to the power source; and (c) a cooler in communication with the reactor, where the cooler has an inlet for product gases and an outlet for cooled mixture, and the product gases from the reactor are fed into the cooler.

In some embodiments, the system contains a gas reclaimer connected to the cooler, where the gas reclaimer has an inlet and an outlet for a reclaimed gas and the cooled mixture from the cooler is fed through the inlet of the gas reclaimer. In some embodiments, the gas reclaimer is a membrane-based system. In other embodiments, the gas separator is a sorbent/solvent-based system or a cryogenic separation system. The concentration of a reclaimed component may be greater in the reclaimed gas than in the gas at the inlet of the reclaimer. In some embodiments, the reclaimed component is hydrogen. In some embodiments, the reclaimed component is used to produce power. In some embodiments, the reclaimed component is methane. In some embodiments, the reclaimed component is fed back into the reactor.

In some embodiments, the system contains a gas separator connected to the reactor, where the gas separator has an inlet for the feed gas stream and an outlet for a concentrated hydrocarbon composition, and the concentrated hydrocarbon composition from the gas separator is fed into the reactor. In some embodiments, the system contains a bottling system. In some embodiments, the bottling system contains a compressor in communication with the gas reclaimer where the reclaimed component is compressed. In some embodiments, the bottling system has a bottler for filling bottles with the reclaimed component.

In one aspect, a system is provided with a high-voltage pulse generator; a reactor and a gas reclaimer. The reactor has an inlet for a gaseous hydrocarbon, an outlet for a liquid hydrocarbon composition to exit the reactor, and an outlet for product gases to exit the reactor and a plurality of first electrodes each individually connected to the power source. The gas reclaimer is in communication with the reactor and has an inlet and an outlet for a reclaimed gas; and the product gases from the reactor are fed into the gas reclaimer. In some embodiments, the reclaimed gas contains hydrogen. In some embodiments, the reclaimed gas comprises one or more types of hydrocarbon. In some embodiments, the hydrocarbons are fed back into the reactor. In some embodiments, the system includes a gas separator in communication with the reactor such that the gas separator has an inlet for the feed gas stream and an outlet for a concentrated hydrocarbon composition, and the concentrated hydrocarbon composition from the gas separator is fed into the reactor.

DETAILED DESCRIPTION

Figure 1:
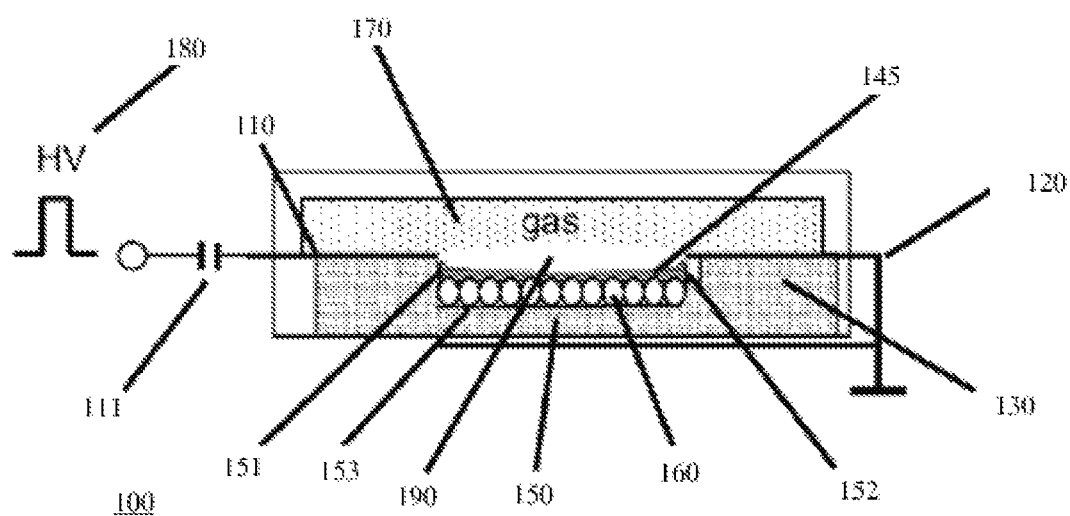
FIG. 1 is a schematic, cross-sectional, view of the electrodes and discharge plasma, in the plasma chamber of a reactor, according to one embodiment.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here. The present technology is also illustrated by the examples herein, which should not be construed as limiting in any way.

In one aspect, a system is provided for the conversion of normally gaseous hydrocarbons to normally liquid hydrocarbons using a non-thermal, repetitively pulsed gliding discharge. The system includes a gas separator in communication with a reaction chamber, the reaction chamber having a plurality of first electrodes connected to a high voltage pulsed power supply, and a plurality of second electrodes that are grounded. The gas separator is configured to receive a feed gas stream that includes, in addition to at least one hydrocarbon gas, other gases that may interfere with, or negatively impact the conversion process of the hydrocarbon gas to liquid hydrocarbons. Such "other gases" are termed "diluent gases" in that they dilute the hydrocarbon gas. The gas separator removes, or at least reduces the amount of the diluent gas in the feed gas stream to produce a concentrated hydrocarbon composition that is then introduced to the reaction chamber.

As used herein, the term "concentrated hydrocarbon composition" refers to a hydrocarbon gas stream which is increased in hydrocarbon content in comparison to the feed gas stream. This may include a single, or sequential, gas separation step(s) to purify the hydrocarbon gas to a desired level prior to introduction to the reaction chamber. As used herein the term "liquid hydrocarbon composition" refers to "liquid hydrocarbon products" or "liquid fuels" and are hydrocarbons that include, but are not limited to $C_5$ to $C_{20}$ alkanes, alkenes, alkynes, their isomeric forms, and mixtures of any two or more such compounds. As used herein, the term "light hydrocarbon materials" are typically those low order hydrocarbons having from one to four carbon atoms. For example, such light hydrocarbon materials may include, but are not limited to, methane, ethane, propane, n-butane, iso-butane, ethylene, propylene, 1-butene, 2-butene, 2-methyl-propylene, or a mixture of any two or more such compounds. In some embodiments, the light hydrocarbons may be those that are associated with natural gas or oil production, or are produced as a result of land-fill operations, or other natural gas deposits or generation.

The gas separator may include a system that is configured to separate one gas from another. Such systems may include, but are not limited to, membrane-based systems, sorbent/solvent-based systems, cryogenic separation, and any other systems as may be known for separating gases. Membrane-based gas separators use a membrane that selectively allows certain components in a gas stream to pass faster than others. Different types of membranes may be used, such as, but not limited to, porous inorganic membranes, palladium membranes, polymeric membranes and zeolites. With regard to separating gases with sorbents/solvents, the gas mixture may be flowed through a packed bed. The material in the packed bed can be polar/non-polar and may contain a catalyst and/or adsorbent. As the gaseous mixture is flowed through the packed bed, different component gases may be adsorbed or slowed down by the packing material depending on the size, polarity or reactivity of the components, while other components pass through faster. As a result, gas components can be separated as they exit the packed bed or may be recovered from the adsorbent. The separation process may be conducted at elevated temperature or pressure.

With regard to cryogenic separation, the mixture of gases may be cooled and each component of the mixture may condense at different points. For example, at atmospheric pressure molecular nitrogen condenses (liquefies) at 77 K (−195.79 C) while methane will condense at 112 K (−161° C.). Thus, a gaseous mixture with nitrogen and methane can be cooled until the methane condenses, removing the still gaseous nitrogen, and the allowing the methane to evaporate as a concentrated hydrocarbon in comparison to the gaseous mixture. Or, a gaseous mixture with hydrogen and methane can be cooled until the methane condenses, removing the still gaseous hydrogen, and the allowing the methane to evaporate as a concentrated hydrocarbon in comparison to the gaseous mixture.

The source of the feed gas stream will determine not only the components considered to be diluent gases, but also the components of desirable hydrocarbons (one or more light hydrocarbon compounds). For example, the feed gas stream may include gases such as, but not limited to, nitrogen, carbon dioxide, oxygen, hydrogen sulfide, and other gases which can dilute the gaseous hydrocarbon, or foul the electrodes. Inclusion of such diluents in the feed can reduce the efficiency of the plasma chemical reactor, or they may react in the plasma to create other reactive components that may be incorporated into the liquid hydrocarbon, thereby reducing the quality of the liquid hydrocarbon product.

One illustrative diluent gas is nitrogen gas. Nitrogen is known to be present in natural gas streams containing hydrocarbons such as methane. Separation of hydrocarbon from the nitrogen may be effected by using methods such as cryogenic separation, as described above, and also pressure swing adsorption and lean oil absorption. Pressure swing adsorption uses a zeolite adsorbent to selectively separate nitrogen from methane. The pressure swing adsorption relies on the physical phenomena that under pressure, different gases adsorb to a substrate at different rates and amounts. By controlling the pressure on the gas mixture and zeolites, nitrogen, for example, can be preferentially adsorbed on the zeolite, allowing for the methane to be drawn off, thereby concentrating the methane. Nitrogen is then released from the adsorbent utilizing pressure and/or thermal changes. Lean oil absorption works similarly in that the oil preferentially absorbs another lipophilic substance, i.e. a hydrocarbon gas such as methane under pressure. This will leave a diluent gas, such as nitrogen in the gaseous phase. After the diluent gas is transferred away from the methane-rich oil, the pressure is reduced and/or the temperature is increased, and the methane is recovered in a more concentrated form than when it was present with the diluent.

In some embodiments, the gaseous hydrocarbon or feed gas stream is processed in a gas separator prior to the reactor ("pre-treatment"). The gas separator may fully, or partially, remove non-hydrocarbon components in the gaseous hydrocarbon or gas feed stream, including non-hydrocarbon components such as nitrogen gas. The gas separator may increase the efficiency of the system by eliminating, or at least minimizing, energy loss due to ionization and/or excitation of nitrogen molecules; thereby eliminating, or at least minimizing, competing processes to the conversion of the gaseous hydrocarbon to the liquid hydrocarbon. The competing processes may occur due to recombination of plasma phase nitrogen (or other diluent gas) ions with electrons of the discharge and with ions of methane or other hydrocarbons in the plasma. When such events occur, they can cause side reactions such as breaking the chain of plasma-chemical conversion, or producing inferior hydrocarbon fuels having contaminants, such as nitrogen or sulfur compounds.

In some embodiments, the feed gas stream is first received in a receiver before processing. In some embodiments, the gas in the receiver is maintained at a relatively high working pressure. In some embodiments, the gas pressure is chosen to ensure continuity in the reactor working medium (e.g. methane) in the system.

The plasma chemical reactor may be as described in co-pending application (U.S. Patent Publication No. 2011/0190565). As a brief summary, the plasma chemical reactor includes a plurality of first electrodes individually connected to a pulsed, high-voltage power source, a plurality of second electrodes that are grounded, and a trough containing a liquid sorbent. Near the trough, the plurality of first electrodes is separated from the plurality of second electrodes by a discharge region where a non-thermal, repetitively pulsed gliding discharge is formed. In the discharge, a plasma is formed when an introduced gaseous hydrocarbon is ionized and recombined to produce a liquid hydrocarbon composition that is absorbed into the liquid sorbent, where it is then conveyed to a collection vessel where the now liquid hydrocarbon fuel may be used or transported to a final point of use more readily than the gaseous feed stream that was originally obtained.

In a second aspect, a gas reclaimer may be included in a system, after the reactor. The gas reclaimer may be used in such a system either with or without the gas separator. The gas reclaimer is essentially a gas separator that acts on the product gases from the plasma reactor. The product gases, which may contain materials such as, but not limited to, unreacted gaseous hydrocarbons (such a methane, ethane, propane, and/or butane), hydrogen, nitrogen, carbon dioxide, hydrogen sulfide, and the like, may be separated into these individual components by the gas reclaimer, or the gas reclaimer may separate out one or more of these gases for further processing or use. For example, the gas reclaimer may separate the unreacted hydrocarbon gases and recycle them to the inlet of the plasma reactor such that loss of the hydrocarbon feed stock is eliminated or at least reduced.

In one embodiment, the gas reclaimer not only recycles the unreacted hydrocarbon, but concurrently with, or in a sequential gas reclamation stage, it is also configured to separate hydrogen from the product stream from the plasma reactor. The hydrogen gas may then be used in a fuel cell system, or burned with oxygen to generate heat or electricity to reduce the overall energy consumption of the system. The power generated by the hydrogen can be used to provide/augment the power to the reactor for plasma generation to improve efficiency of the system. The power generated by the hydrogen may be used to provide power to the different components of the system such as the reactor, the gas separator, the cooler and/or the gas reclaimer. In addition, the power generated may be used to power the entire system or may be added to the overall electrical grid. By such recovering useful components, the efficiency of the system may be increased.

The gas reclaimer may include a gas separator as described above. For example, the gas reclaimer may include a system that is configured to separate one gas from another. Such systems may include, but are not limited to, membrane-based systems, sorbent/solvent-based systems, cryogenic separation, and any other systems as may be known for separating gases, and as described above.

The reclaimed gases may be compressed in a compressor for storage and/or transportation or recycled to the reactor or diverted directly to a combustion system or fuel cell for power production. The reclaimed gases may be also be contained in a vessel for storage or transportation.

In a third aspect, a cooler may be attached to the plasma reactor to treat the product gases from the reactor. The cooler cools the gases such that at least some of the hydrocarbon in the product gas condenses to a liquid, thus separating these hydrocarbons from the remaining gases. Various types of coolers can be used, including coolers with circulating refrigerants. The cooler may be a heat exchanger where the gases pass through, while the liquid collects along the walls of the heat exchanger. By the force of gravity, the liquid may be collected in containers. In some embodiments, a temperature set-point of the cooler is such that gaseous light hydrocarbons will condense to a liquid light hydrocarbon.

After recovery of the liquid light hydrocarbons, they may be warmed until a gaseous state of the hydrocarbon is obtained, and the gas may be fed back into the plasma chemical reactor as additional feed stock for the plasma reactor. Alternatively, after recovery of the liquid light hydrocarbon, it may be collected for other fuel uses or as chemical feedstocks. Recovery of these gaseous light hydrocarbons increases the efficiency of the system and of the feed gas source such that they are not lost in the product gas from the plasma reactor.

Referring now the figures, FIG. 1 illustrates one embodiment of the reactor where the gaseous hydrocarbon is converted into liquid fuels. As briefly summarized above, in the reactor, the first electrodes and second electrodes are separated by a discharge region, or gap. The first and second electrodes are arranged in pairs, such that for each first electrode, a second electrode is located on the opposite side of the discharge region. The discharge region is located in close proximity to the trough which contains a liquid sorbent. When a high-voltage potential is applied to the first electrode, a discharge results within the discharge region. The discharge then propagates from the first electrode to its paired second electrode. The propagation of the discharge is along the surface of the liquid sorbent, or within close proximity of the surface of the liquid of the liquid sorbent. Because the discharge is said to propagate from the first electrode to the second electrode in a sliding, or gliding, fashion along the surface of the liquid sorbent, such a discharge is termed, "a gliding discharge." To maintain the discharges, the high-voltage potential is pulsed, with each pulse responsible for a discharge. The discharges that are initiated and maintained by the device are non-thermal. As such, the device produces, a non-thermal, repetitively pulsed gliding discharge.

The plasma that is generated in the operation of the device is a non-thermal plasma. As used herein, the term "non-thermal plasma," or "cold plasma," are plasmas that are not in a state of thermodynamic equilibrium. While the electrons in non-thermal plasmas have high electron temperatures, the temperature of the other atoms and molecules in the plasma are relatively low, hence the system is not in thermodynamic equilibrium. In comparison to a non-thermal plasma, thermal plasmas, or "hot plasmas," are produced as a result of strong gas heating in a gas discharge to the temperature of several thousand Kelvin, and, as a result, the energy distribution of the gas molecules, ions and electrons in the thermal plasma, and the system, is in thermodynamic equilibrium accompanied by pyrolysis. The resulting large number of collisions between particles, in particular, between electrons and heavy positive ions or neutral particles, leads to rapid redistribution of energy so that thermodynamic equilibrium is reached. Thus, the temperature in the discharge region is uniformly very high for all particles.

In addition to the electrodes and trough, the reaction chamber also includes a gas inlet for the introduction of gaseous hydrocarbons to the chamber in which the discharge occurs; a liquid sorbent inlet and outlet through which the liquid sorbent may be circulated in the trough; a product outlet; and a vent through which gases may be vented from the chamber. The reaction chamber geometry and design is not particularly limited and may be, but is not limited to, an annular (i.e. circular) arrangement, polygonal (i.e. triangular, square or rectangular, pentagonal, hexagonal, etc.) arrangement, a linear arrangement, or other arrangement as may be designed. The electrodes may be mounted on to the reactor body.

In various embodiments, the device may also include a meter for determination of flow, or flow rate, of the purified hydrocarbon gas stream to the reaction chamber. The device may also include a fluid pump for circulation of the liquid sorbent. The device may also include a collection, or product reservoir. The device may also include devices for capturing, or scrubbing, vent gases from the reaction chamber.

In FIG. 1, a reaction chamber 100 includes a plurality of first electrodes 110 which are connected through capacitors 111 to a high-voltage source 180. The reaction chamber 100 also includes a plurality of second electrodes 120 that are grounded. The first electrodes 110 and the second electrodes 120 are aligned such that each first electrode 110 has a paired second electrode 120, and are spaced from one another by a gap, or discharge region 190, in which a light hydrocarbon gas 170 is located and which is subjected to a plasma that causes the light hydrocarbon gas 170 to be reformed into a heavier hydrocarbon liquid. The gap, or discharge region, 190, is where the non-thermal gliding discharge is initiated and maintained. As illustrated, the discharge region 190 is located immediately above a trough 150 that is formed into a body 130 of the reaction chamber 100, the trough 150 having a first wall 151, a second wall 152, and a basin 153. The first and second electrodes 110, 120 are also located in close proximity to the trough 150, with the first electrode(s) 110 located near a top edge of the first wall 151 and the second electrode(s) 120 located near a top edge of the second wall 152.

The body 130 of the reaction chamber 100 is a substrate that provides for mounting of the first and second electrodes 110, 120 and in which the trough 150 is formed. Suitable materials for the body 130 include insulators known in the art, such as, but not limited to, plastic materials, such as polyethylene, polyethylene terephthalate, polypropylene, nylon, polytetrafluoroethylene (Teflon), styrene, and blends or co-polymers thereof; glass; or ceramics. In some embodiments, the body 130 is made from Teflon. Further detailed description of the system is provided in U.S. Patent Publication No. 2011/0190565.

Operation of the systems described herein includes introducing a gas mixture that includes a diluted hydrocarbon feed gas to a gas separator to produce a concentrated hydrocarbon gas stream that is introduced into a gaseous hydrocarbon inlet. The concentrated hydrocarbon gas stream is then directed to the gas discharge chamber of a plasma reactor which includes a non-thermal, repetitively pulsed gliding discharge. When the light hydrocarbons ($C_1$-$C_4$) contact the non-thermal, repetitively pulsed gliding discharge, the radicals that form re-arrange to re-form saturated liquid $C_5$-$C_{20}$ hydrocarbons, and a product gas. The product gas may be optionally cooled by a cooler to condense the various components of the product gas, and/or the product gas may be directed through a gas reclaimer to separate the various components of the product gas. Hydrocarbon gases collected from the cooler or gas reclaimer may be recycled into the system for further processing. Additionally, hydrogen, $H_2$, may be collected and used in other reactions or for other uses, or may be vented to the environment.

In one aspect, a system is provided for preparing a liquid hydrocarbon from a gaseous feed stock that contains a diluted hydrocarbon gas. As illustrated schematically in FIG. 2, the system 200 includes a power source 230 for generating pulses of high voltage potential, a plasma reactor 210, a feed gas source 220, and a gas separator 270. Feed gas source 220 may include a direct gas line or a gas receiver for pressurization, or a combination thereof. The gas separator 270 has a first gas inlet 269 to introduce the feed gas from the feed gas source 220 into the gas separator 270, and a first gas separator outlet 271 that is configured to convey a concentrated hydrocarbon gas to the plasma reactor 210 via a plasma reactor inlet 209. The gas separator 270 is used for pre-treatment of the feed gas to remove one or more diluent gases that may be exited from the system at outlet 275, and produce a concentrated hydrocarbon gas for processing in the plasma reactor 210. The concentrated hydrocarbon gas is introduced into the plasma reactor 210 via the plasma reactor inlet 209. The feed gas is then converted by the plasma reactor 210 into a liquid hydrocarbon fuel and a product gas. The liquid hydrocarbon fuel is conveyed from the plasma reactor 210 via a first plasma reactor outlet 250. The liquid hydrocarbon fuel may then be used directed, collected for storage and/or transportation, or further processed. The product gas is conveyed from the plasma reactor 210 via a second plasma reactor outlet 260. The product gas may be conveyed to the atmosphere or for further processing and reclamation of the gases.

Figure 2:
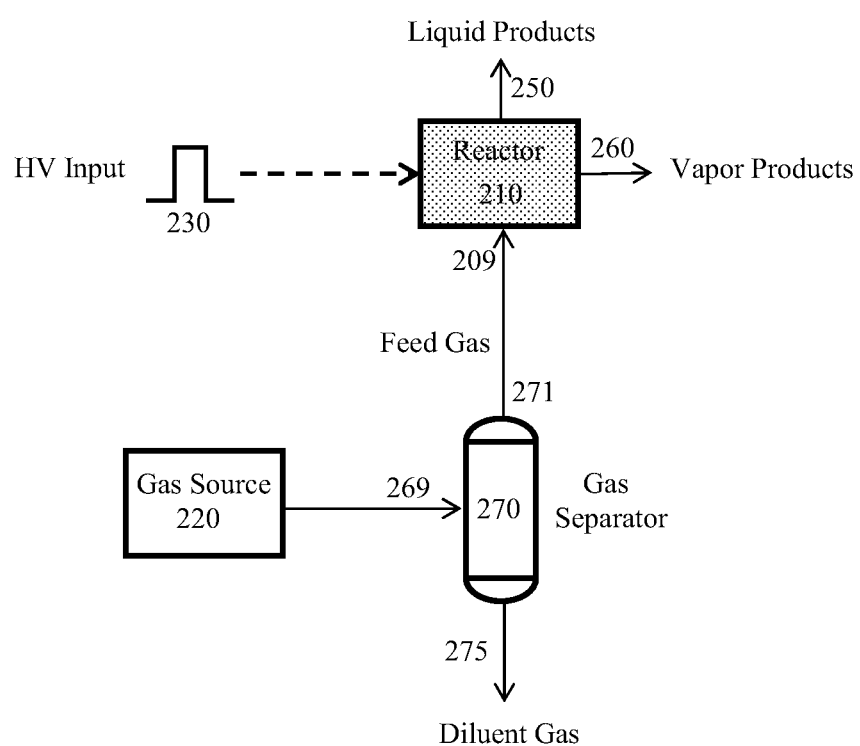
FIG. 2 is a flowchart of a system for conversion of gaseous hydrocarbon to liquid fuel according to various embodiments including a gas separator to improve conversion efficiency.
Figure 3:
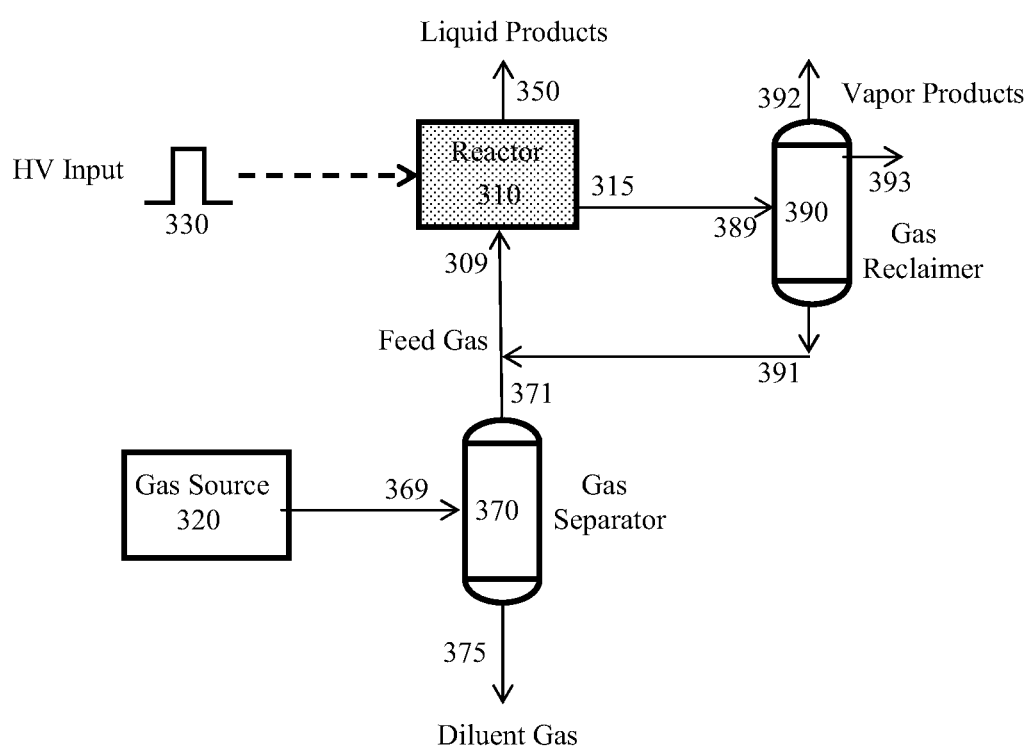
FIG. 3 is a flowchart of a system for conversion of gaseous hydrocarbon to liquid fuel according to various embodiments including a cooler to improve conversion efficiency.

In another aspect a liquid hydrocarbon fuel production system, such as that illustrated in FIG. 2, may also include a gas reclaimer for processing the product gases from the reactor. Such a system is illustrated in FIG. 3. As described above, the gas reclaimer can process the product gas to provide low molecular weight hydrocarbons for recycling to the feed gas for the reactor, reclaim hydrogen gas for use in a fuel cell or storage, and/or remove other diluent gases that may be further separated or used in other processes. Such systems may include the gas separator, or the gas separator may be absent.

In FIG. 3 the system 300 includes a power source 330 for generating pulses of high voltage potential, a plasma reactor 310, a feed gas source 320, a gas reclaimer 390, and optionally, a gas separator 370. The feed gas source includes a hydrocarbon gas that is introduced to the plasma reactor 310 via a reactor inlet 309. If the feed gas source contains a diluted hydrocarbon gas, where concentration of the hydrocarbon gas is desired, the feed gas source 320 may, optionally, convey the diluted hydrocarbon gas to a gas separator 370 via a first gas separator inlet 369. The gas separator 370 then separates one or more diluent gases from the feed gas thereby producing a concentrated hydrocarbon gas stream that is conveyed from the gas separator 370 by a first gas separator outlet 371 to the plasma reactor inlet 309; and the diluent gas may be vented from the gas separator 370 via a second gas separator outlet 375. In the plasma reactor 310, the hydrocarbon gas is converted into a liquid hydrocarbon fuel that is conveyed from the plasma reactor via a first plasma reactor outlet 350 to a storage or end use destination. During the production of the liquid hydrocarbon fuel in the plasma reactor 310, product gases are produced which are conveyed from the plasma reactor 310 via a second plasma reactor outlet 315. The product gas that is conveyed from the plasma reactor 310 may be further processed in a gas reclaimer 390. The gas reclaimer 390 may be configured to accomplish one or both of recovering hydrogen gas from the product gas, or recovering light hydrocarbon gas or gases from the product gas. Recovered hydrogen gas may be conveyed to a fuel cell to produce electricity that may then be used by the power source or other components of the system, or it may be stored for later consumption. Recovered hydrocarbon gases may be used as recovered as a fuel source, or they may be recycled to the plasma reactor inlet 309 for further processing in the plasma reactor 310 to reform the light hydrocarbon gas into the heavier liquid hydrocarbon fuels. The gas reclaimer 390 has a gas reclaimer inlet 389 for receiving the product gas from the plasma reactor 310, a first gas reclaimer outlet 391 for recycling light hydrocarbon gases back to the plasma reactor 310, and other gas reclaimer outlets 392, 393, etc. for reclaiming other gases, or for allowing venting of unreclaimed gases.

Figure 4:
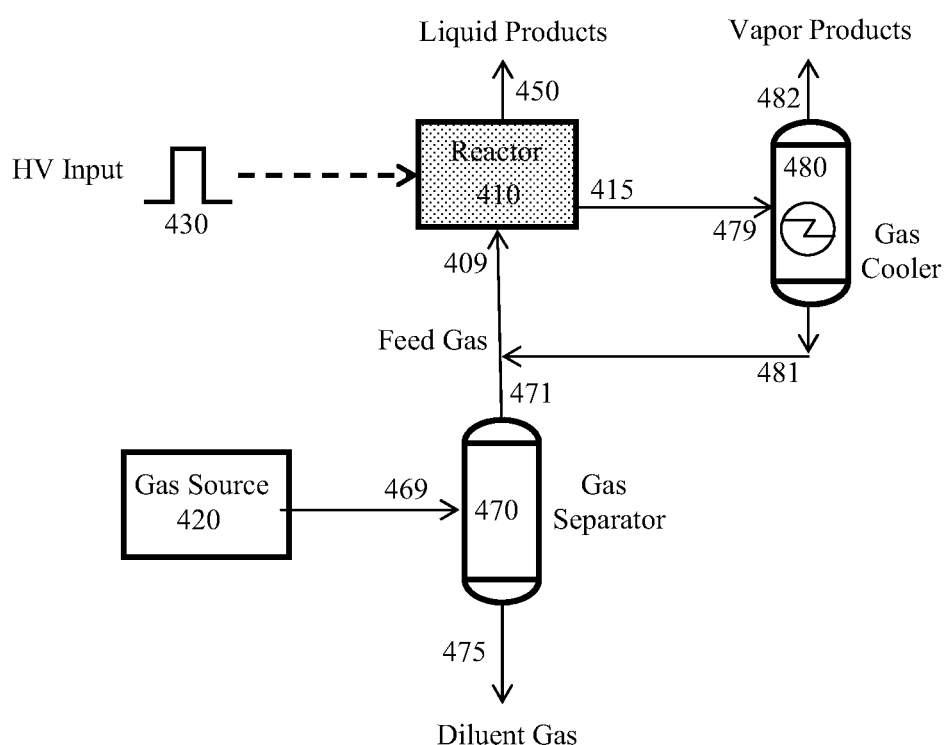
FIG. 4 is a flowchart of a system for conversion of gaseous hydrocarbon to liquid fuel according to various embodiments including a gas separator and gas reclaimer to improve conversion efficiency.

In another aspect, a liquid hydrocarbon fuel production system, such as that illustrated in FIGS. 2 and 3, may also include a gas cooler for processing the product gases from the reactor. Such a system is illustrated in FIG. 4. As described above, the gas cooler cools the product gases for easier processing an handling, either as a cold gas, or a liquid.

In FIG. 4, illustrates a system 400 for producing liquid hydrocarbon fuels, the system includes a gas cooler 480. Such a system may include a power source 430 for generating pulses of high voltage potential, a feed gas source 420, a plasma chemical reactor 410, and the cooler 480 for cooling the product gases from the reactor 410. In operation, a feed gas, which includes a hydrocarbon gas, is fed into the plasma reactor 410 via the plasma reactor inlet 409. As illustrated in FIG. 4, the feed gas source 420 may be, optionally connected to a gas separator 470, however this is not required. In the plasma reactor 410, the hydrocarbon gas is converted to a liquid hydrocarbon fuel, which is conveyed from the plasma reactor 410 via a first plasma reactor outlet 450 to a storage or end use destination. In the plasma reactor 410, a product gas is also produced which is then conveyed from the plasma reactor 410 via a second plasma reactor outlet 415. The product gas is then directed to the cooler 480 via a cooler inlet 479. Upon cooling of the product gas, liquid hydrocarbons, or other liquids may be condensed and conveyed from the cooler 480 via a first cooler outlet 460, where the liquid hydrocarbon is desired to be returned to the plasma reactor 410, it may be conveyed from the cooler 480 to the plasma reactor 410 via second cooler outlet 481. The third cooler outlet 482, or another cooler outlet (not pictured) may act as a vent for other, non-condensed gases from the system. Where the system 400 does include a gas separator 470, a diluted hydrocarbon feed gas may be supplied to the gas separator 470 from a feed gas source via gas separator inlet 469. In the gas separator 470 the dilute hydrocarbon gas is concentrated to a concentrated hydrocarbon gas which is then conveyed via the gas separator outlet 471 to the plasma reactor 420 via the plasma reactor inlet 409; and the diluent gas may be vented from the gas separator 470 via a second gas separator outlet 475.

Figure 5:
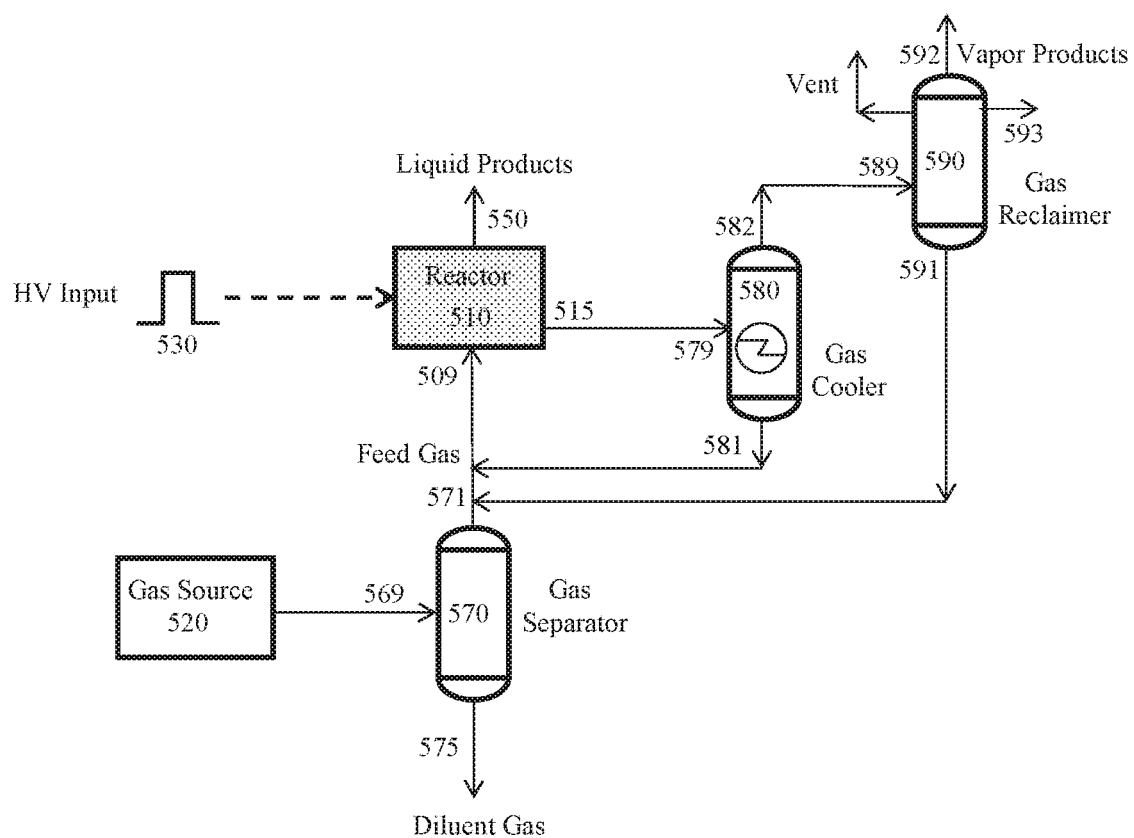
FIG. 5 is a flowchart of a system for conversion of gaseous hydrocarbon to liquid fuel according to various embodiments including a cooler and gas separator to improve conversion efficiency.

In another aspect, a hydrocarbon fuel production system may include a cooler and a gas reclaimer in combination to further increase the efficiency of the system. Such a system is illustrated in FIG. 5. The system 500, illustrated in FIG. 5, includes both a gas cooler 580 and a gas reclaimer 590 for recovering reclaimed gas. As with the systems described above, the system illustrated in FIG. 5 also includes a power source 530 for generating pulses of high voltage potential, a feed gas source 520, and a plasma chemical reactor 510, along with the cooler 580 and the gas reclaimer 590. The feed gas is fed from the feed gas source 520 to the plasma reactor 510 through a reactor inlet 509. After conversion of the feed gas into a liquid hydrocarbon fuel in the plasma reactor 510, the liquid hydrocarbon fuel is conveyed from the plasma reactor 510 via a first reactor outlet 550 to a storage or end use destination. Product gases are conveyed from the plasma reactor 510 via a second reactor outlet 515 to a cooler 580. via a cooler inlet 579. Upon cooling of the product gas, liquid hydrocarbons, or other liquids may be condensed and conveyed from the cooler 580 via a first cooler outlet 581, where the liquid hydrocarbon is desired to be returned to the plasma reactor 510. The cooler 580 may also have a vent 582. Gases that are not condensed by the cooler 580 may be conveyed to a gas reclaimer 590 via a third gas cooler outlet 583 through gas reclaimer inlet 589. After gas separation in the gas reclaimer 590, as described above for other gas reclaimers, gaseous light hydrocarbons may be returned to the plasma reactor 510 for further conversion to higher order hydrocarbons via a first gas reclaimer outlet 591 and plasma reactor inlet 509. Other gas reclaimer outlets 592, 593, etc. may be used for reclaiming other gases in other reclaimers and/or coolers (not pictured) that may be further connected to the system; or allowing venting of unreclaimed gases. It should be noted that in systems that have both a gas reclaimer and a gas cooler, the relative positions of those components may be reversed such that instead of the gas cooler being between the plasma reactor and the gas reclaimer, as shown in FIG. 5, the system may include a gas reclaimer between the plasma reactor and the gas cooler. Where the system 500 does include a gas separator 570, a diluted hydrocarbon feed gas may be supplied to the gas separator 570 from a feed gas source via gas separator inlet 569. In the gas separator 570 the dilute hydrocarbon gas is concentrated to a concentrated hydrocarbon gas which is then conveyed via the gas separator outlet 571 to the plasma reactor 510 via the plasma reactor inlet 509; and the diluent gas may be vented from the gas separator 570 via a second gas separator outlet 575.

Any of the above systems may include various vessels, containment systems, or conveyance equipment to transport, convey, or store gases and liquid products that are obtained by the process. For example, where the system includes a gas reclaimer that separates hydrogen gas from the product gases from the system, a bottling station or piping mechanism may be included (not illustrated) to either store the hydrogen in compressed gas cylinders, or convey the hydrogen to a fuel cell or other combustion system to harness the energy from the hydrogen and use it for powering the system or other equipment, or putting the energy back on the grid in the form of electrical energy.

It is understood that the system can have some variations depending on the application. For example, a system with a gas reclaimer may be advantageous even without the gas separator where the concentration of the diluent gas is low.

The devices described herein are amenable to being modular, scalable, and portable, thus making transport and use at otherwise hard to reach areas, such as off-shore drilling rigs and environmentally sensitive areas, a facile process. The devices are capable of converting natural gas into a stable fuel such as diesel, gasoline, light synthetic oil, kerosene and other hydrocarbon fuels that can be transported over the road, sea or rail in ordinary fuel transport vehicles.

As used herein, "about" will be understood by persons of ordinary skill in the art and will vary to some extent depending upon the context in which it is used. If there are uses of the term which are not clear to persons of ordinary skill in the art, given the context in which it is used, "about" will mean up to plus or minus 10% of the particular term.

As used herein, "plurality" refers to two or more of the items used in conjunction with the term. For example, a plurality of electrodes may refer to two or more electrodes, or as many electrodes as necessary for the construction of a device containing the electrodes, and limited only by the physical dimensions of the device and its components.

The embodiments, illustratively described herein may suitably be practiced in the absence of any element or elements, limitation or limitations, not specifically disclosed herein. Thus, for example, the terms "comprising," "including," "containing," etc. shall be read expansively and without limitation. Additionally, the terms and expressions employed herein have been used as terms of description and not of limitation, and there is no intention in the use of such terms and expressions of excluding any equivalents of the features shown and described or portions thereof, but it is recognized that various modifications are possible within the scope of the claimed technology. Additionally, the phrase "consisting essentially of" will be understood to include those elements specifically recited and those additional elements that do not materially affect the basic and novel characteristics of the claimed technology. The phrase "consisting of" excludes any element not specified.

All publications, patent applications, issued patents, and other documents referred to in this specification are herein incorporated by reference as if each individual publication, patent application, issued patent, or other document was specifically and individually indicated to be incorporated by reference in its entirety. Definitions that are contained in text incorporated by reference are excluded to the extent that they contradict definitions in this disclosure.

The devices and methods thus generally described above, will be understood by reference to the following examples, which are not intended to be limiting of the device or methods described above in any manner.

EQUIVALENTS

The present disclosure is not to be limited in terms of the particular embodiments described in this application. Many modifications and variations can be made without departing from its spirit and scope, as will be apparent to those skilled in the art. Functionally equivalent methods and compositions within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can of course vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like, include the number recited and refer to ranges which can be subsequently broken down into subranges as discussed above. Finally, as will be understood by one skilled in the art, a range includes each individual member.

While certain embodiments have been illustrated and described, it should be understood that changes and modifications can be made therein in accordance with ordinary skill in the art without departing from the technology in its broader aspects as defined in the following claims.

What is claimed is:

1. A system comprising:
    a power source configured to provide pulses of high-voltage potential;
    a gliding discharge plasma reactor comprising:
        a reactor inlet configured to introduce a concentrated gaseous hydrocarbon to the reactor,
        a first reactor outlet configured to convey a liquid hydrocarbon composition from the reactor,
        a second reactor outlet configured to convey an exhaust gas from the reactor, and
        a plurality of first electrodes separated from a plurality of second electrodes by a discharge region; and
    a gas separator in communication with the reactor inlet, wherein
        the gas separator comprises:
            a first gas separator inlet configured to introduce a feed gas stream to the gas separator; and
            a first gas separator outlet configured to convey the concentrated hydrocarbon composition from the gas separator to the reactor inlet;
        wherein the feed gas stream comprises a dilute gaseous hydrocarbon.

2. The system of claim 1, wherein the dilute gaseous hydrocarbon comprises a hydrocarbon gas and a diluent gas.

3. The system of claim 2, wherein the diluent gas comprises nitrogen.

4. The system of claim 2, wherein the gas separator comprises a membrane for separating a diluent gas from the feed gas stream.

5. The system of claim 1 further comprising a gas reclaimer comprising a first gas reclaimer inlet in communication with the second reactor outlet; and a first gas reclaimer outlet.

6. A system comprising:
    a power source configured to provide pulses of high-voltage potential;
    a gliding discharge plasma reactor comprising:
        an inlet for a gaseous hydrocarbon,
        an outlet for a liquid hydrocarbon composition to exit the reactor, and
        an outlet for product gases to exit the reactor and a plurality of first electrodes each individually connected to the power source; and
    a cooler in communication with the reactor comprising:
        an inlet for product gases,
        an outlet for a first cooled mixture, and
        an outlet for a second cooled mixture that is conveyed to the inlet of the gliding discharge plasma reactor,
    wherein the product gases from the reactor are fed into the cooler, and wherein the cooler is configured to separate the first cooled mixture from the second cooled mixture.

7. The system of claim 6 further comprising a gas reclaimer in communication with the cooler, wherein the gas reclaimer comprises an inlet and an outlet for a reclaimed gas and the first cooled mixture from the cooler is fed through the inlet of the gas reclaimer.

8. The system of claim 7, wherein the gas reclaimer is a membrane-based system.

9. The system of claim 7, wherein the concentration of a reclaimed component is higher in the reclaimed gas than in the gas at the inlet of the reclaimer.

10. The system of claim 9, wherein the reclaimed component is hydrogen.

11. The system of claim 9, wherein the reclaimed component is used to produce power.

12. The system of claim 9, wherein the reclaimed component is a hydrocarbon gas.

13. The system of claim 9, wherein the reclaimed component is fed back into the reactor.

14. The system of claim 7 further comprising a gas separator in communication with the reactor, wherein the gas separator comprises an inlet for the feed gas stream and an outlet for a concentrated hydrocarbon composition, and the concentrated hydrocarbon composition from the gas separator is fed into the reactor.

15. The system of claim 6 wherein the second cooled mixture comprises one or more hydrocarbon gasses.

16. The system of claim 7 wherein the cooler further comprises an outlet for a third cooled mixture.

17. The system of claim 16 wherein the third cooled mixture is vented to an atmosphere.

18. A system comprising:
a power source configured to provide pulses of high-voltage potential;
a gliding discharge plasma reactor comprising:
  an inlet for a gaseous hydrocarbon,
  an outlet for a liquid hydrocarbon composition to exit the reactor, and
  an outlet for product gases to exit the reactor and a plurality of first electrodes each individually connected to the power source;
a gas reclaimer in communication with the reactor comprising:
  an inlet for a reclaimed gas,
  an outlet for the reclaimed gas, and
  an outlet for one or more hydrocarbons that are conveyed to the inlet of the gliding discharge plasma reactor,
  wherein the product gases from the reactor are fed into the gas reclaimer,
  and wherein the reclaimer is configured to separate the reclaimed gas from the one or more hydrocarbons, and
a gas separator in communication with the reactor, wherein the gas separator comprises an inlet for a feed gas stream and an outlet for a concentrated hydrocarbon fed into the reactor.

19. The system of claim 18, wherein the reclaimed gas comprises hydrogen.

20. The system of claim 18, wherein the reclaimed gas comprises one or more hydrocarbons.

21. The system of claim 18, further comprising a cooler configured to cool the product gases from the reactor, wherein cooled product gases from the cooler are fed into the gas reclaimer.

* * * * *